United States Patent [19]
Carney et al.

[11] Patent Number: 5,640,309
[45] Date of Patent: Jun. 17, 1997

[54] PCI EXPANSION CARD RETAINER CLIP

[75] Inventors: James M. Carney, Pepperell; Dave Desilets, Hopkinton, both of Mass.; Clifford Willis, Tracy; Alan Lee Winick, San Jose, both of Calif.; Christopher E. Chiodo, Andover, Mass.

[73] Assignee: Sun Microsystems, Inc., Mountain View, Calif.

[21] Appl. No.: 675,281

[22] Filed: Jul. 1, 1996

[51] Int. Cl.$^6$ .................................................. H05K 7/14
[52] U.S. Cl. ..................... 361/801; 361/683; 361/684; 361/686; 361/747; 361/759; 361/800; 211/41.1
[58] Field of Search ........................... 361/600, 679, 361/683, 684, 685, 686, 796, 800, 818, 747, 759, 701; 174/35 R; 312/223.2, 223.1, 216, 293.3; 211/26, 41; 292/102, 107; 248/500, 298.1, 309.1

[56] References Cited

U.S. PATENT DOCUMENTS

| | | | |
|---|---|---|---|
| 4,768,652 | 9/1988 | Fallon | 206/373 |
| 4,979,075 | 12/1990 | Murphy | 361/686 |
| 5,004,867 | 4/1991 | Mast | 174/35 GC |
| 5,544,006 | 8/1996 | Radloff et al. | 361/683 |

*Primary Examiner*—Leo P. Picard
*Assistant Examiner*—Phuong T. Vu
*Attorney, Agent, or Firm*—Julian Caplan Flehr Hohbach Test Albritton & Herbert

[57] ABSTRACT

Computers are manufactured with connectors in which are inserted at least one PCI expansion card to increase the capacity of the computer. A computer enclosure panel is formed with an opening for insertion and withdrawal of the card. The card has a cover which blocks the opening after the card has been plugged in. The invention provides a retainer clip mounted on the rear panel which, when in operative position, attaches to the panel and engages the cover to assist in holding the card in place. The clip has a bent spring which may be compressed to install and remove the clip. The invention further provides room for the tab conventionally extending outward of the card to extend outward of the enclosure so that the card may be located closer to the side panel, thereby conserving space within the enclosure. Computers as shipped from the factory many times are not provided with PCI cards and the opening in the panel is blocked by a removable blanking cover. The clip also holds the blanking cover in position.

11 Claims, 4 Drawing Sheets

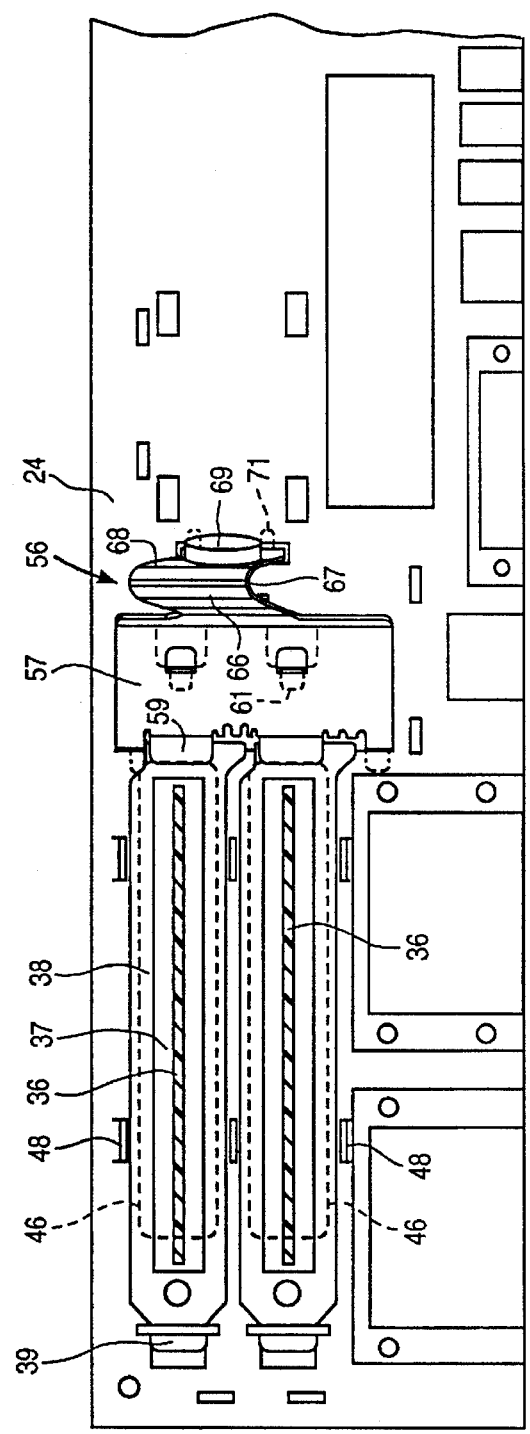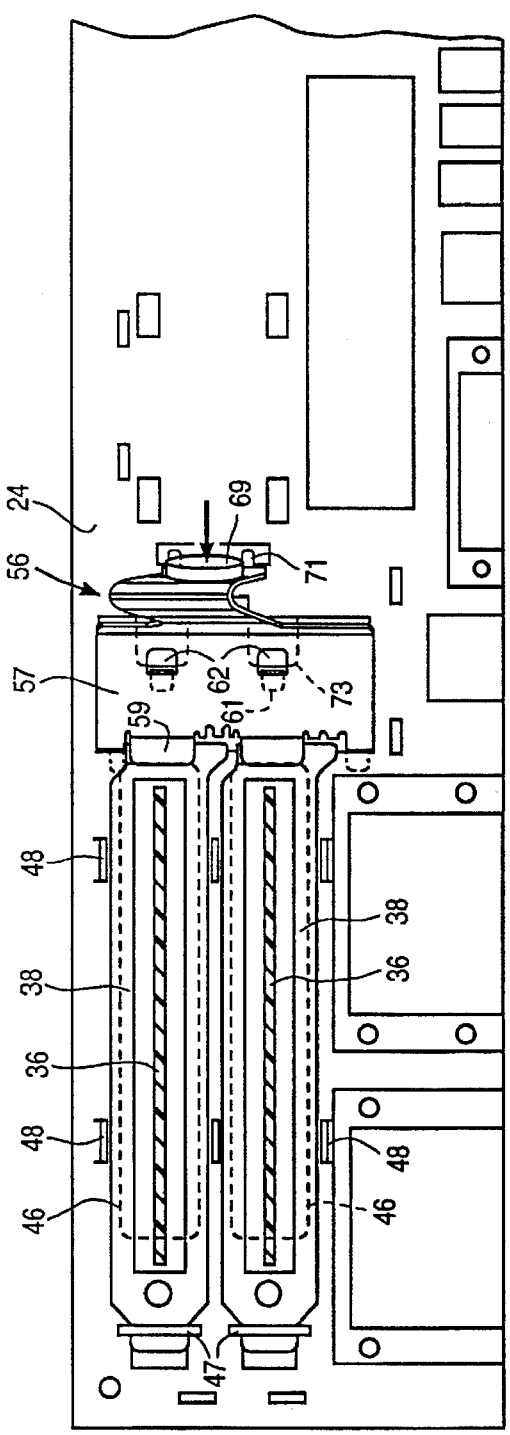
FIG. 3
FIG. 4

PCI EXPANSION CARD RETAINER CLIP

BACKGROUND OF THE INVENTION

1. Field of the Invention

This invention relates to a new and improved PCI expansion card retainer clip. More particularly, the invention relates to a retainer which engages a cover fixed to such card, retaining the cover in place blocking an opening formed in a wall of the computer enclosure.

2. Description of Related Art

PCI cards conventionally have been sold with a vertical cover or plate along one edge having an outward extending tab. When the card is plugged into pin connectors inside the computer enclosure, the cover blocks an I/O opening in the wall of the casing. Conventionally a screw has been used to attach a tab on the cover to a bracket on the enclosure. The present invention provides a retainer for the cover which does not require use of such a screw or equivalent fastener.

SUMMARY OF THE INVENTION

The present invention comprises a removable retainer attached to a panel of a computer enclosure. In inoperative position a conventional PCI card or a blanking cover (used when no card is installed) may be installed or removed in an opening in a panel of the enclosure. When the clip is in operative position, the card or blanking cover is secured in place. Use of the cover shields against EMI and dust and is a safety precaution.

As has been explained, heretofore a screw has been used to attach a tab extending outwardly of the cover to a bracket on the computer enclosure. Attaching and detaching such screws requires considerable manual dexterity and is time consuming. Furthermore, frequently the screw falls into the enclosure and is difficult to find and remove. Such problems are avoided by use of this invention.

Another feature of the invention is that heretofore the outer end of the tab attached to the plate has been connected to the computer panel, which requires that the edge of the card be spaced from the panel a distance approximately equal to the length of the tab (which for practical purposes is approximately ½"). The present invention enables the card to be located closer to the panel, the tab projecting outwardly of the housing and thereby making more of the space within the enclosure usable.

A further feature of the invention is that conventionally there are two openings in the panel of the computer enclosure to accommodate two separate cards and the clip of the present invention retains the covers for both openings. Where only one or no cards are used, blocking covers are used and the present invention can retain both a card cover and a blocking cover, two card covers or two blanking covers.

In accordance with the present invention a hole must be formed in the panel adjacent the I/O openings. The retainer of the present invention has means for filling his hole as the retainer is moved to closed position.

The present invention provides means for attaching the retainer to the panel of the enclosure firmly on all axes.

Another feature of the invention is the ease with which the user may move the clip between operative and inoperative positions.

The retainer of the present invention comprises a spring clip formed with a plate which blocks a hole formed in the enclosure panel. Fingers projecting from an edge of the plate engage the outside of the panel and also engage and hold in place the covers, either of the PCI cards or the blanking covers used when no cards are employed. The plate also has outward bent tabs which fit through openings in the panel. Along the edge of the plate opposite the aforementioned fingers is a resilient portion having two leaves which normally diverge outwardly, but which may be gripped by the fingers of the user to compress the leaves into approximately parallel position. Tabs on one of the leaves fit through apertures in the panel of the enclosure. Accordingly, by merely inserting the fingers of the plate into engagement with the exterior of the enclosure plate and the card covers and then squeezing the spring leaves together so that tabs on one of the spring leaves enter holes in the side panel, and then releasing the clip, the clip is held in position on the panel and the card covers secured in place. When it is necessary to remove a cover, the spring clip is compressed, releasing the tabs from the holes in the side panel and permitting the clip to be removed from a position engaging the card covers.

The mechanism of the present invention is actuated with the cover of the enclosure off, inasmuch as the clip is disengageable only from the inside of the enclosure. Hence, any lock which is embodied for the enclosure cover improves the security of the device.

BRIEF DESCRIPTION OF THE DRAWINGS

The accompanying drawings, which are incorporated in and form a part of this specification, illustrate embodiments of the invention and, together with the description serve to explain the principles of the invention.

In FIG. 1, no PCI card is installed, but the openings in the enclosure therefor are closed by removable blanking covers.

In FIG. 2 one PCI card is installed in the enclosure.

FIG. 3 is an enlarged side elevational view of a portion of the panel of the computer construction showing two cards installed and the retainer clip in place.

FIG. 4 is a view similar to FIG. 3 showing a step in the removal of the clip.

DETAILED DESCRIPTION OF THE PREFERRED EMBODIMENT

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
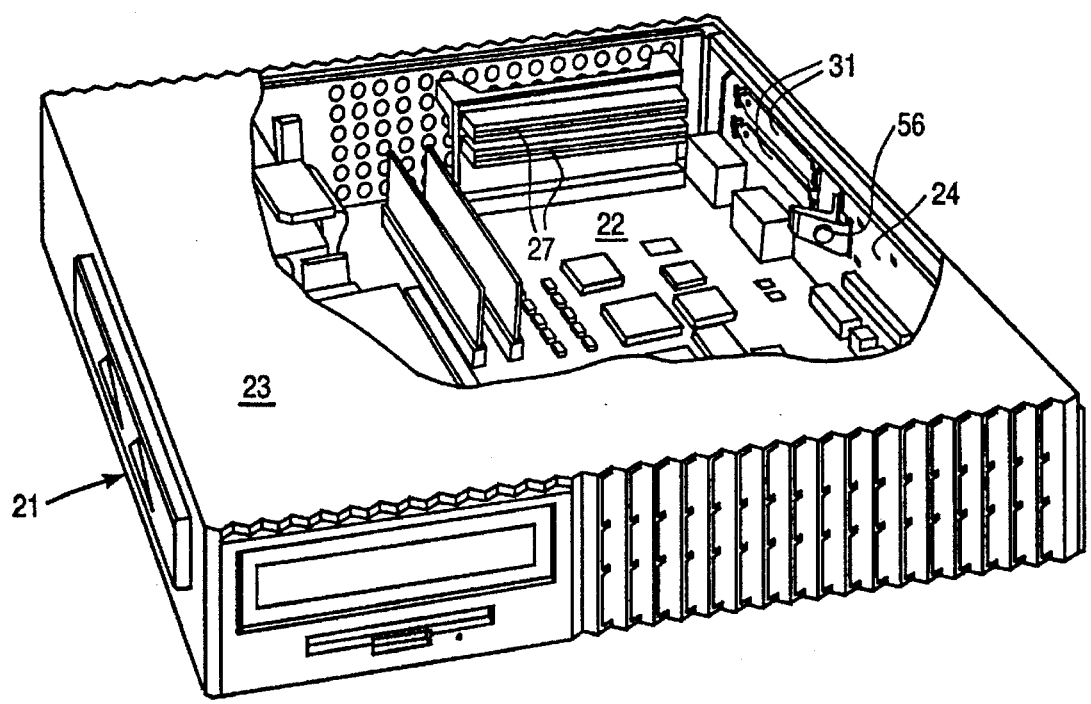
FIG. 1 is a perspective view of a computer enclosure with the cover broken away to reveal internal construction.
Figure 2:
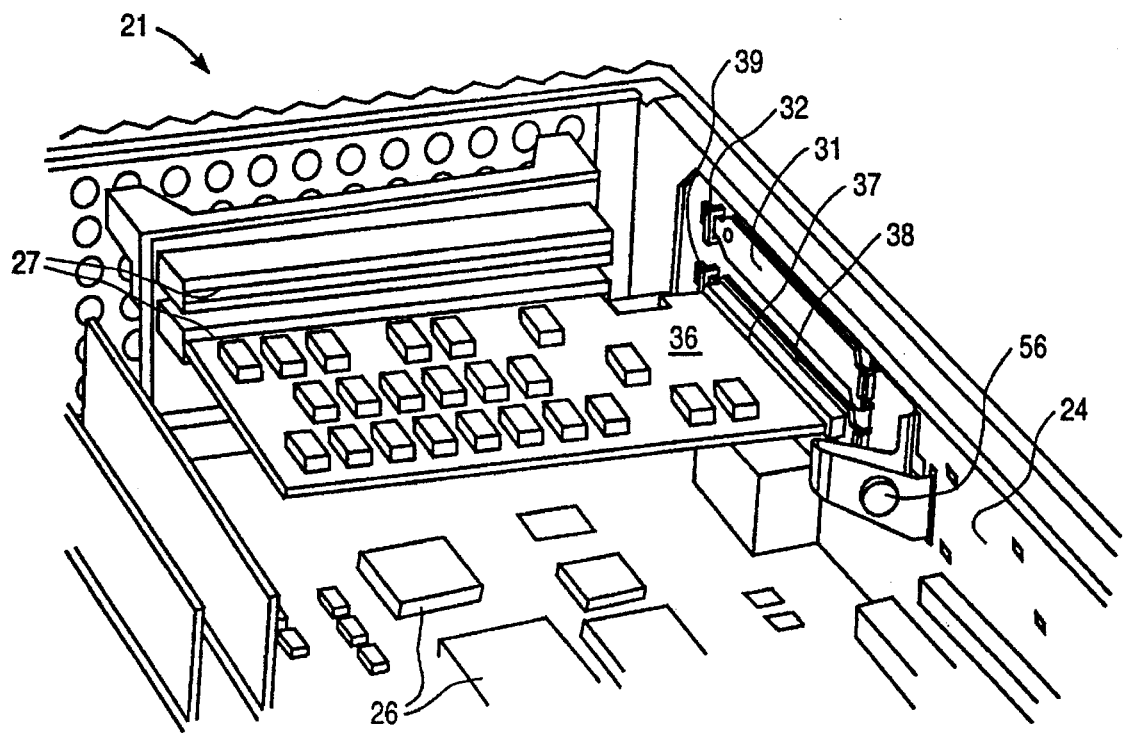
FIG. 2 is an enlarged perspective view of a portion of the structure of FIG. 1.
Figure 5:
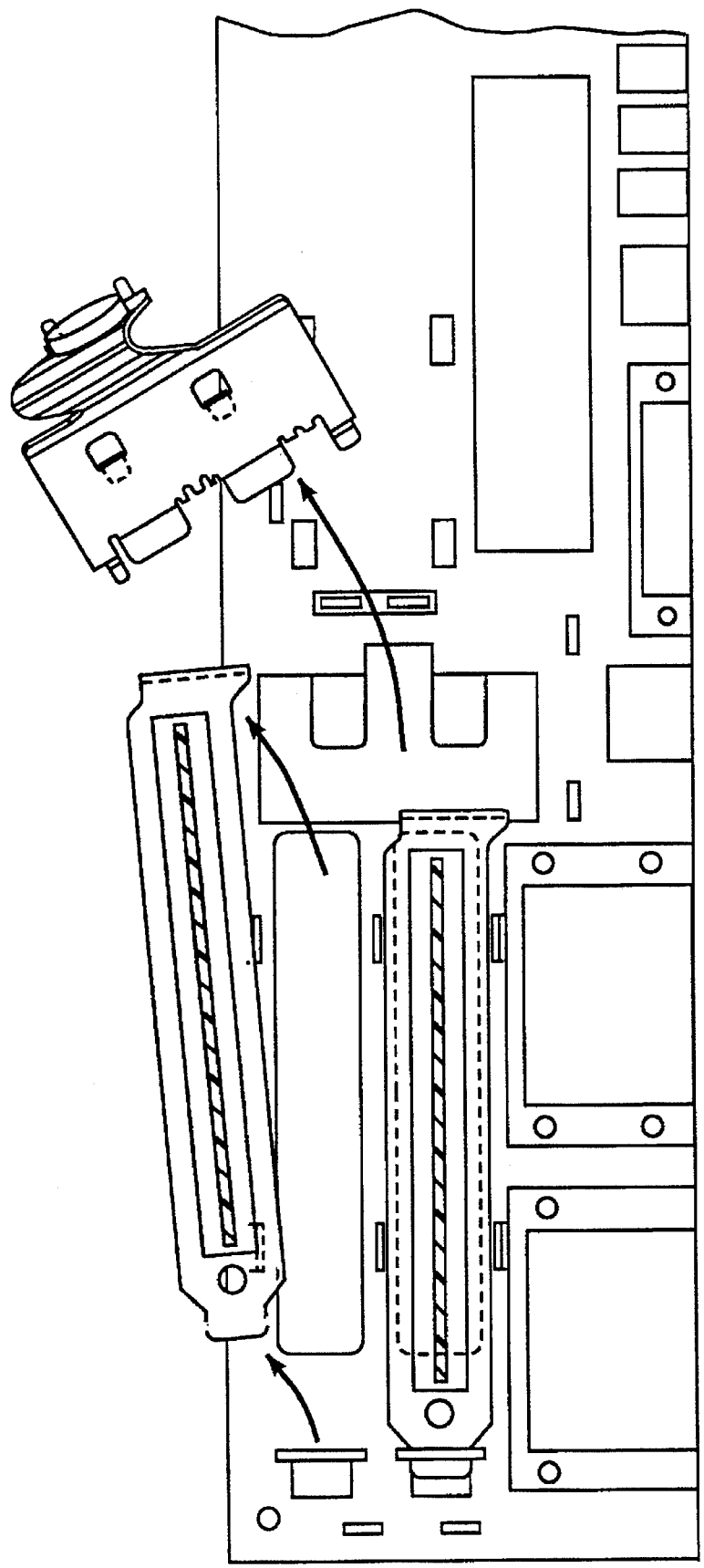
FIG. 5 is a view similar to FIG. 3 showing one of the PCI cards in the process of being removed.
Figure 6:
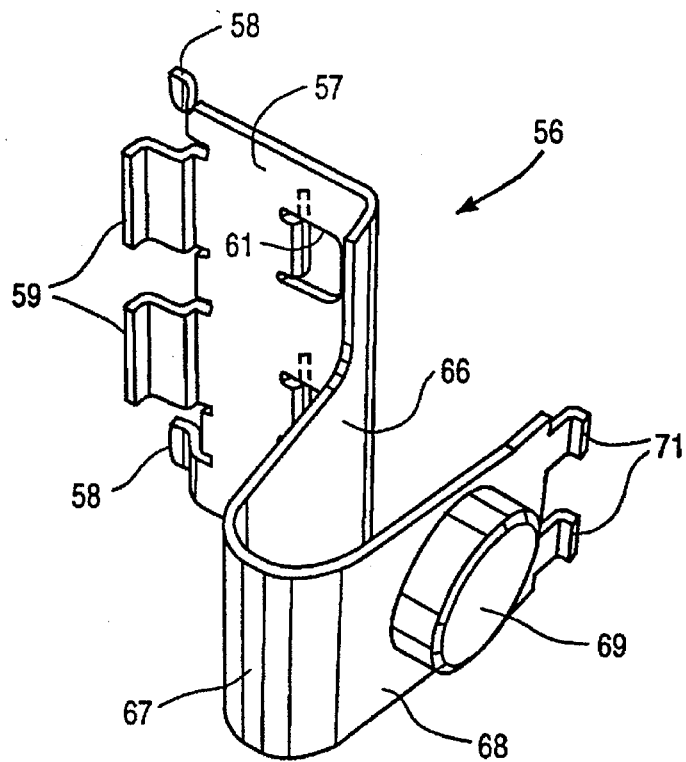
FIG. 6 is an enlarged perspective view showing the retainer.
Figure 7:
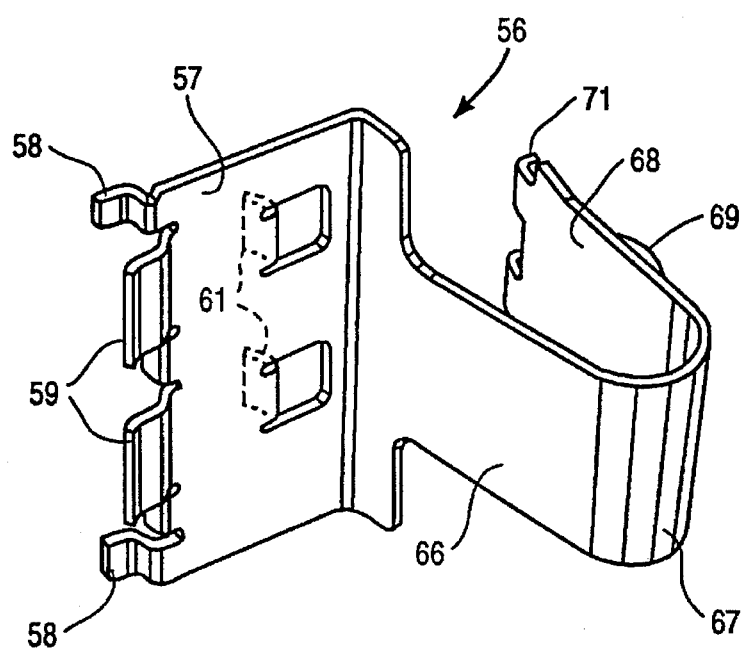
FIG. 7 is a perspective view of the structure of FIG. 6 viewed from an opposite angle.

Enclosure 21 has a bottom 22 and top 23 and at least one vertical panel 24. Various electronic components 26 may be installed on bottom 22. Adjacent rear panel 24 are two horizontally spaced apart connectors 27 of a type well known in the industry. The PCI cards 36 hereinafter described are plugged into the connectors 27. However, as shown in FIG. 1, no cards are installed. Accordingly, blanking covers 31 are used to close off openings 46 in panel 24, there being two such covers 31 shown, each having a tongue 32 and an outwardly protruding tab 33. In FIG. 2, one of the blanking covers 31 is removed and a PCI card 36 is installed in lower connector 27.

PCI card 36 is of a type well known in the industry. Technical specifications of such cards are set forth in a publication entitled: *PCI Local Bus Specification, Rev. 2. 0. Chapter 5, Mechanical Specification,* published by PCI Special Interest Group of Hillsboro, Oreg. One longitudinal edge of card 36 is connected to one of the connectors 27. A lateral edge of card 36 is formed with an edge reinforcement 37 and externally thereof is a metallic cover 38. Cover 38 has an extending tongue 39 at one end and a laterally outwardly bent tab 41 at its opposite end. In prior practice, a screw (not shown) is used to connect the tab 41 to a bracket (also not shown) on the interior of panel 24. The present invention eliminates the necessity for use of the screw or similar means of attachment.

Elongated rectangular openings 46 are formed in panel 24, of a length slightly greater than the distance required to disconnect the contacts (not shown) on card 36 from connector 27. Where no PCI card is used, blanking covers 31 are used to close such openings and when cards 36 are used, the covers 38 close such openings. Adjacent one end of opening 46 is a tongue receptor 47 which receives tongue 39 and holds it in place. Inward projecting cover edge guides 48 are positioned above and below the longitudinal edges of openings 46 to engage the top and bottom edges of cover 38 (or 31).

Rearward of openings 46 is vertically elongated rectangular opening 49 which is used to facilitate insertion and remove card 36 where the enclosure cover 23 is closed and when the present invention is not employed. Clip 56 is formed with a substantially rectangular plate 57 which is of a size to close off the opening 59. An edge of plate 57 has upper and lower outside fingers 58 which fit through opening 49 and engage the exterior of panel 24. On the same edge of plate 57 are inside fingers 59 which engage the ends of covers 38 (or 31) opposite tongues 39. Plate 57 also has outwardly struck tabs 61 which fit through opening 49 and engage protrusions 62 into opening 49. The tabs 61 prevent retraction movement of plates 57 relative to panel 24. Bent approximately at right angles to the edge of plate 57 opposite fingers 58 and 59 is an inward projecting leaf 66 which is formed at its inner end with a bend 67 from which is a return leaf 68 which in the relaxed position of the clip diverges from projection 66. Finger grip 69 may be fixed to return 68 in order to assist in gripping the same. The distal edges of return 68 are formed with tabs 71 which may be inserted in holes 72 in panel 24 as hereinafter explained.

In order to use the clip 56, tongues 39 are inserted in receptors 47 and cards 36 are plugged into connectors 27 with the tabs 36 extending outwardly of panel 24 through openings 46. The user then installs the plate 57 in position with finger 58 on the exterior of the panel 24 and fingers 59 engaging the nearest end of covers 38 (or blanking covers 31) and also inserts the tabs 51 through opening 49. The user then squeezes the clip 56 by placing a thumb or finger on the grip 69 and other fingers on the leaf 66 so that the tabs 71 may be inserted in the hole 72. Upon release of the grip, the clip remains attached to the panel 24 and the covers 38 or 31 are firmly held in place along all axes.

What is claimed is:

1. In combination, an enclosure panel formed with an opening having a first opening end and a second opening end, a cover shaped to close said opening having a first cover end and a second cover end, first means adjacent and first opening end for securing a first cover end to said panel, second means movable between a first position adjacent said second opening end to retain said second cover end to said panel and a second position remote from said second cover end, said second means comprising a clip having panel engaging means, resilient means biasing said panel engaging means in a first direction, said clip being compressible to move said panel engaging means in a second direction opposite said first direction, said panel being formed with an opening to receive said panel engaging means when said clip is compressed in said second direction and to retain said clip attached to said panel when said clip is released and said panel engaging means moves in said first direction.

2. The combination of claim 1 which further comprises a PCI card, said cover being secured to said cover.

3. The combination of claim 1 in which said panel is formed with a second opening adjacent said first-mentioned opening, said clip having a blanking portion closing said second opening when said second means is in first position.

4. The combination of claim 1 which further comprises a finger on said clip extending through said opening and engaging said panel when said second means is in first position.

5. The combination of claim 1 which further comprises a finger on said clip engaging said cover when said second means is in first position.

6. The combination of claim 1 in which said panel is formed with a second opening parallel to and below said first-mentioned opening, a second cover having a third cover end and a fourth cover end shaped to close said second opening, third means adjacent said first opening end for securing said third cover end to said panel, said second means retaining said fourth cover end to said panel when said second means is in first position.

7. The combination of claim 1 in which said clip comprises a plate, a first spring leaf extending from said plate, a second spring leaf disposed at an acute angle relative to said first spring leaf, means resiliently connecting said leaves together, said plate having first panel engaging means, said second spring leaf having second panel engaging means, said panel having an aperture to receive said second panel engaging means, whereby when said spring leaves are squeezed together said first and second panel engaging means may be installed in said opening and said aperture, respectively, said first and second panel engaging means securing said clip to said panel when said spring leaves are released.

8. The combination of claim 7 in which said means resiliently connecting said leaves together comprises a bend, said plate, said leaves and said bend being integral.

9. The combination of claim 7 in which said first panel engaging means comprises fingers on said plate which extend out through said opening and engage the exterior of said panel.

10. The combination of claim 7 in which said second panel engaging means comprises a bent tab extending through said aperture and engaging the exterior of said panel.

11. The combination of claim 7 in which said panel is formed with an enlarged second opening adjacent said first-mentioned opening, said plate blocking said second opening, said first panel engaging means extending through said second opening.

* * * * *